(12) United States Patent
Kovac et al.

(10) Patent No.: US 9,184,702 B2
(45) Date of Patent: Nov. 10, 2015

(54) PEAK-TO-AVERAGE RATIO DETECTOR

(71) Applicant: Peregrine Semiconductor Corporation, San Diego, CA (US)

(72) Inventors: David Kovac, Arlington Heights, IL (US); Kelly Michael Mekechuk, Austin, TX (US)

(73) Assignee: Peregrine Semiconductor Corporation, San Diego, CA (US)

( * ) Notice: Subject to any disclaimer, the term of this patent is extended or adjusted under 35 U.S.C. 154(b) by 149 days.

(21) Appl. No.: 13/962,541

(22) Filed: Aug. 8, 2013

(65) Prior Publication Data
US 2015/0042406 A1 Feb. 12, 2015

(51) Int. Cl.
*H03G 3/20* (2006.01)
*H03F 1/02* (2006.01)
*H03F 1/32* (2006.01)
*H03F 3/19* (2006.01)

(52) U.S. Cl.
CPC ............ *H03F 1/0222* (2013.01); *H03F 1/0233* (2013.01); *H03F 1/32* (2013.01); *H03F 3/19* (2013.01); *H03F 2200/102* (2013.01); *H03F 2200/451* (2013.01)

(58) Field of Classification Search
CPC ...................................... H03F 1/0222
USPC ................. 330/127, 129; 455/127.1
See application file for complete search history.

(56) References Cited

U.S. PATENT DOCUMENTS

| | | | |
|---|---|---|---|
| 2008/0182530 A1* | 7/2008 | Mueller et al. | 455/115.1 |
| 2009/0156143 A1* | 6/2009 | Shute | 455/127.2 |
| 2011/0070848 A1* | 3/2011 | Ramachandra Reddy | 455/127.2 |
| 2012/0157020 A1* | 6/2012 | Sasaki et al. | 455/127.1 |
| 2014/0266433 A1 | 9/2014 | Nobbe et al. | |
| 2014/0266455 A1 | 9/2014 | Kaatz et al. | |
| 2014/0266460 A1 | 9/2014 | Nobbe et al. | |

* cited by examiner

*Primary Examiner* — Khanh V Nguyen
*Assistant Examiner* — Khiem Nguyen
(74) *Attorney, Agent, or Firm* — Jaquez Land Richman LLP; Martin J. Jaquez, Esq.; Alessandro Steinfl, Esq.

(57) ABSTRACT

An amplifier circuit with a peak-to-average ratio detector is described. Detection of the peak-to-average ratio value can be used to tune one or more parameters that affect linearity of one or more amplifiers in the amplifier circuit to improve amplifier performance.

30 Claims, 4 Drawing Sheets

FIG. 4

PEAK-TO-AVERAGE RATIO DETECTOR

BACKGROUND

1. Field

The present application relates to detection of peak-to-average ratio in a circuit. More particularly, the present application relates to peak-to-average ratio (PAR) detectors.

2. Description of Related Art

Linearity of an amplifier can be adjusted in different ways, which include adjustment of bias, periphery (e.g. size of a scalable periphery amplifier), load line, and supply voltage of the amplifier. Linearity of the amplifier can also be adjusted using pre-distortion methods, in both the analog or digital domain. Although there is no preferred method of adjusting the linearity of the amplifier, the most common and easiest way is to adjust the bias or the supply voltage of the amplifiers. By adjusting the amplifier to operate at a power level where linearity begins to degrade, a maximum efficiency for the amplifier can be achieved.

SUMMARY

According to a first aspect of the present disclosure, an arrangement is described comprising: one or more amplifiers configured, during operation of the arrangement, to provide a first signal; a detector operatively coupled to the first signal and configured, during operation of the arrangement, to detect an envelope of a coupled signal to produce an envelope signal; a filter operatively connected to the detector and configured, during operation of the arrangement, to filter the envelope signal to produce an average power signal that corresponds to an average power of the coupled signal; a subtractor operatively connected to the detector and the filter and configured, during operation of the arrangement, to produce a difference signal that corresponds to the difference between the envelope signal and the average power signal; and a circuital arrangement operatively connected to the subtractor and configured, during operation of the arrangement, to adjust one or more parameters of the one or more amplifiers based on the difference signal.

According to a second aspect of the present disclosure, an arrangement is described comprising: one or more amplifiers configured, during operation of the arrangement, to provide a first signal; a detector operatively coupled to the first signal and configured, during operation of the arrangement, to detect an envelope of a coupled signal to produce an envelope signal; an analog-to-digital converter operatively connected to the detector and configured, during operation of the arrangement, to produce a digital signal that corresponds to a digital version of the envelope signal; a first filter operatively connected to the analog-to-digital converter and configured, during operation of the arrangement, to filter the digital signal to produce a digital average power signal that corresponds to a digital version of an average power of the envelope signal; a subtractor operatively connected to the analog-to-digital converter and the first filter and configured, during operation of the arrangement, to produce a difference signal that corresponds to the difference between the digital signal that corresponds to a digital version of the envelope signal and the digital signal that corresponds to a digital version of the average power of the envelope signal; and a circuital arrangement operatively connected to the subtractor and configured, during operation of the arrangement, to adjust one or more parameters of the one or more amplifiers based on the difference circuit output signal.

According to a third aspect of the present disclosure, a method is described comprising: feeding an input signal to a plurality of amplifiers; splitting an amplified input signal, one branch of the amplified input signal being provided to a detector as a split amplified input signal; detecting an envelope of the split amplified input signal; producing an envelope signal based on the detected envelope of the split amplified input signal; filtering the envelope signal to produce an average power signal of the split amplified input signal; subtracting the average power signal from the envelope signal to produce a difference signal corresponding to a peak-to-average ratio of the split amplified input signal; converting the difference signal from an analog signal to a digital signal; producing logic output signals as a function of the digital difference signal; and adjusting linearity of the plurality of amplifiers based on the logic output signals.

According to a fourth aspect of the present disclosure, a method is described comprising: feeding an input signal to a plurality of amplifiers; splitting an amplified input signal, one branch of the amplified input signal being provided to a detector as a split amplified input signal; detecting an envelope of the split amplified input signal; producing an envelope signal based on the detected envelope of the split amplified input signal; converting the envelope of the split amplified input signal from an analog signal to a digital signal; filtering a digital envelope signal to produce a digital average power signal of a digital split amplified input signal; subtracting the digital average power signal from the digital envelope signal to produce a digital difference signal corresponding to a digital peak-to-average ratio of the split amplified input signal; producing logic output signals as a function of the digital difference signal; and adjusting linearity of the plurality of amplifiers based on the logic output signals.

According to a fifth aspect of the present disclosure, a method for affecting operation of an amplifier is provided, the method comprising: generating a peak-average ratio signal based on an output signal of an amplifier; based on the generating, producing one or more control signals adapted to control operation of the amplifier; feeding the one or more control signals to the amplifier, and based on the feeding, affecting an operational parameter of the amplifier.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

In order to adjust linearity of an amplifier to improve efficiency, it may be useful to determine the amount of linearity of an output of an amplifier at a given time. Teachings according to the present disclosure relate to optimizing operation of a power amplifier based on a signal available to the power amplifier, such as an input signal to the power amplifier or an output signal from the power amplifier, using dedicated control circuitry. Related systems and methods for optimizing amplifier operation using various control circuitry can be found in, for example, U.S. patent application Ser. No. 13/828,121, entitled "Systems and Methods for Optimizing Amplifier Operations", filed on Mar. 14, 2013, which is incorporated herein by reference in its entirety.

Peak-to-average ratio (PAR) is a measurement of a waveform, generally calculated from peak amplitudes of the waveform divided by the root mean square (RMS) values of the waveform. In a system where linearity degradation measurements, such as Adjacent Channel Leakage Ratio (ACLR) or Error Vector Magnitude (EVM), can be correlated to the PAR, measuring the PAR can assist in quantifying the quality of the waveform through one or more amplifiers.

Figure 1:
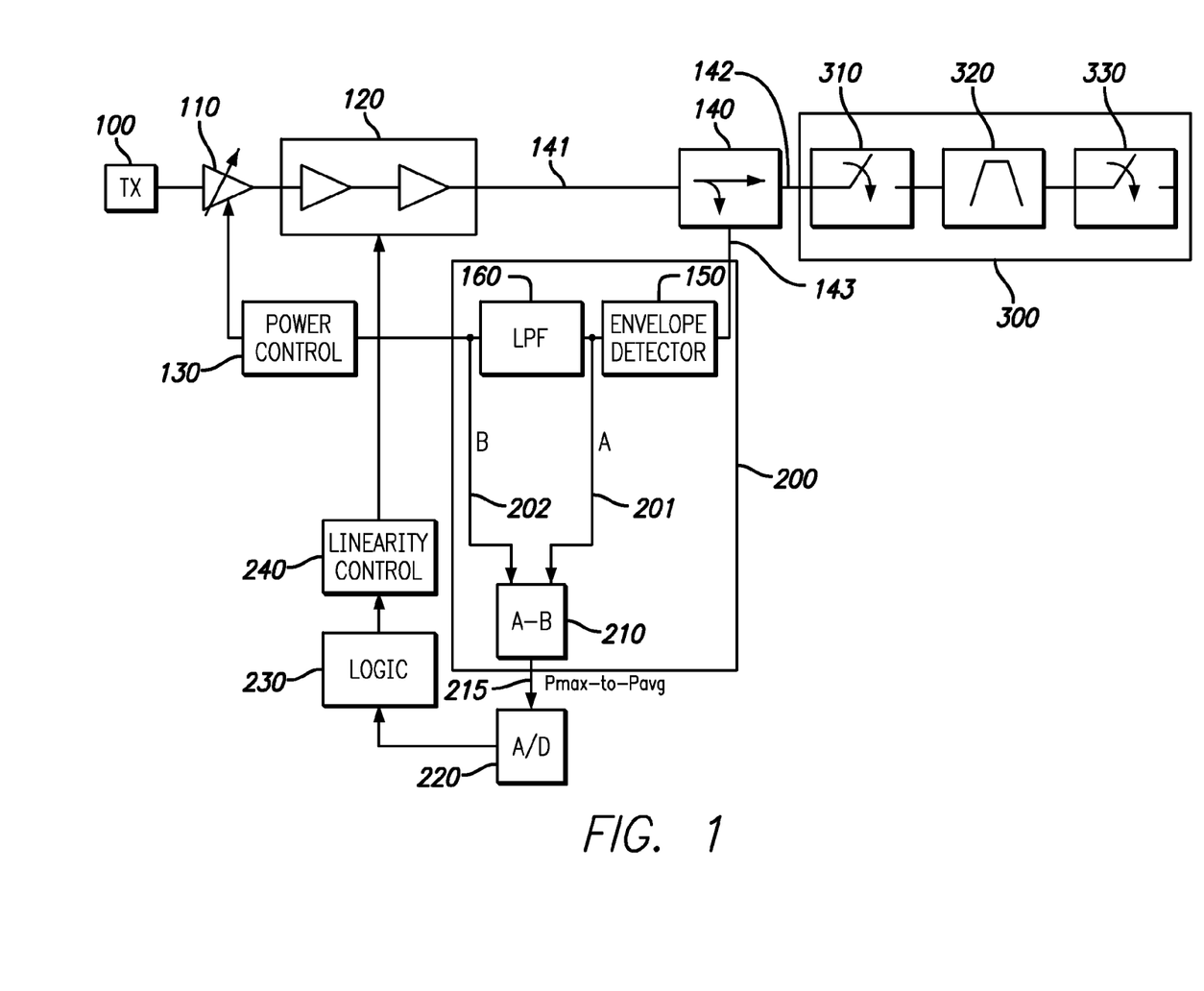
FIG. 1 shows an embodiment according to the present disclosure comprising one or more amplifiers, a peak-to-average ratio (PAR) detector and associated circuitry to measure and adjust the linearity of the one or more amplifiers.

FIG. 1 shows a circuit arrangement according to an embodiment of the present disclosure comprising a transceiver (100), a variable gain amplifier (110), a power control circuit (130), one or more amplifiers (120), a coupler (140), and a peak-to-average ratio (PAR) detector (200) with associated circuitry (230) and (240) used to measure and adjust the linearity of the one or more amplifiers (120).

The transceiver (100) provides an input signal to the circuit arrangement. The variable gain amplifier (110) can be part of the power control circuit (130). In particular, the variable gain amplifier (110) adjusts the output level of the RF signal of the transceiver (100) entering the one or more amplifiers (120) based on a comparison between a reference level and a low-pass filtered output from the PAR detector (200), which will be described below. The low-pass filtered output from the PAR detector (200) is also represented as a signal B (202), as also described below.

Furthermore, in the embodiment shown in FIG. 1, the PAR detector (200) comprises an envelope detector (150), a low-pass filter (160) and a subtractor (210) that obtains a PAR value (215). The envelope detector (150) is a circuit which takes a modulated RF signal as the input signal and has an output which is an AC envelope of the input signal (referred to as an envelope signal). The envelope signal can be equivalent to tracking successive peak values of the input signal.

As seen in FIG. 1, the PAR detector (200) first acquires two signals, a signal A (201) and a signal B (202). To obtain the signal A (201) and the signal B (202), the output (141) of the one or more amplifiers (120) is fed into the envelope detector (150) of the PAR detector (200) through an RF coupler (140). A three-port RF coupler can be used for the purposes of the present disclosure, although couplers with more ports may also be used. The RF coupler (140) splits the output signal (141) to produce a first split signal (transmitted signal) (142) and a second split signal (coupled signal) (143). By way of example, and not of limitation, the RF coupler (140) can generally be configured to split the output signal (141) such the transmitted signal (142) contains a majority of signal power from the output signal (141) while the coupled signal (143) contains a remainder of signal power from the output signal (141). Design of the RF coupler is within the capabilities of a person skilled in the art. By way of example and not of limitation, the RF coupler can have a coupling factor of −20 dB.

The transmitted signal (142) can be sent to a downstream circuit (300). In the embodiment shown in FIG. 1, the exemplary downstream circuit (300) comprises a first switch (310) with an output that is connected to a filter (320), the output of the filter being connected to a second switch (330). In other embodiments, the downstream circuit (300) can comprise a load, an antenna, a plurality of selectable filters, or other circuit elements. According to some embodiments of the present disclosure the load can be a tunable matching circuit adapted to efficiently transfer a power of the transmitted signal (142) to a next stage, such as an antenna. IN some embodiments the tunable matching circuit may include variable/configurable harmonic terminations, such as harmonic shorts and/or harmonic opens, configured, for example, to adapt output stage of the amplifier to different modes and frequency bands. More information on variable harmonic terminations can be found in, for example, U.S. patent application Ser. No. 13/797,686, entitled "Variable Impedance Match and Variable Harmonic Terminations for Different Modes and Frequency Bands", filed on Mar. 12, 2013, which is incorporated herein by reference in its entirety. The coupled signal (143) is sent to the envelope detector (150).

Other embodiments of the present disclosure may use alternative methods to split the output signal (141) to provide a transmitted signal (142) and a coupled signal (143). One embodiment may have the output signal (141) capacitively coupled to the envelope detector (150). Another embodiment could be realized by having the RF coupler (140) closer to an antenna (e.g. as an output of the downstream circuit (300) of FIG. 1) instead of the output of the one or more amplifiers (120). In such embodiment, the RF coupler (140) is implemented as a broadband RF coupler.

With continued reference to FIG. 1, the envelope detector (150) detects an envelope of the coupled signal (143) and outputs the signal A (201) that corresponds to the envelope of the coupled signal (143). In an embodiment of the present disclosure, the envelope detector (150) may be implemented using a diode. Alternatively, the envelope detector (150) may be implemented using other types of detectors as well, such as a root mean square (RMS) detector.

As shown in FIG. 1, low-pass filter (160) filters the signal A (201) to produce the signal B (202) that corresponds to an average power of the coupled signal (143). In one embodiment, the low-pass filter (160) can be implemented by using an RC filter. In another embodiment, an operational amplifier low-pass filter could also be used as the low-pass filter.

Signal B (202) is used in two different instances within the circuit arrangement of FIG. 1. In a first use, signal B (202) is sent to the power control circuit (130). The power control circuit (130) sets the output power of the transceiver (100) by comparing signal B (202) to a reference level. If signal B (202) is lower than a reference level, then the variable gain amplifier (110) is adjusted to increase the transceiver (100) output power. On the other hand, if signal B (202) is higher than the reference level, then the variable gain amplifier (110) is adjusted to decrease the transceiver output power.

Furthermore, as shown in FIG. 1, the subtractor (210) computes a difference between the signal A (201) and the signal B (202) to produce a signal C (or the PAR value) (215) (e.g. C=A−B). The subtractor (210) can be implemented using, for example, an operational amplifier and/or using standard techniques known to a person skilled in the art.

Generally, the coupled signal (143) is an RF signal defined as $(X(t)+Y)*\cos(\omega t+\phi t)$. $X(t)$ is a time varying amplitude modulation of the RF signal, Y is proportional to an absolute power of the RF signal, $\omega$ is a frequency of the RF signal (where $\omega=2\pi f$), and $\phi(t)$ is a time varying phase of the RF signal.

Following FIG. 1, the output of the envelope detector (150), identified as signal A (201), is proportional to the instantaneous RF envelope of the RF signal. Signal A is proportional to the sum of the time varying amplitude modulation signal X(t) and the absolute power of the RF signal (Y), A∝X(t)+Y. Signal B (202), the result of signal A (201) after being processed by the low pass filter (160), is proportional to the absolute power of the RF signal (Y) because the amplitude modulation is eliminated during the low pass filtering, B∝Y. The resulting signal, signal C, after the subtractor (210) contains only the time varying amplitude modulation of the RF signal, C=A−B∝X(t). Relative to the RF signal, signal C is a low frequency signal.

Figure 2:
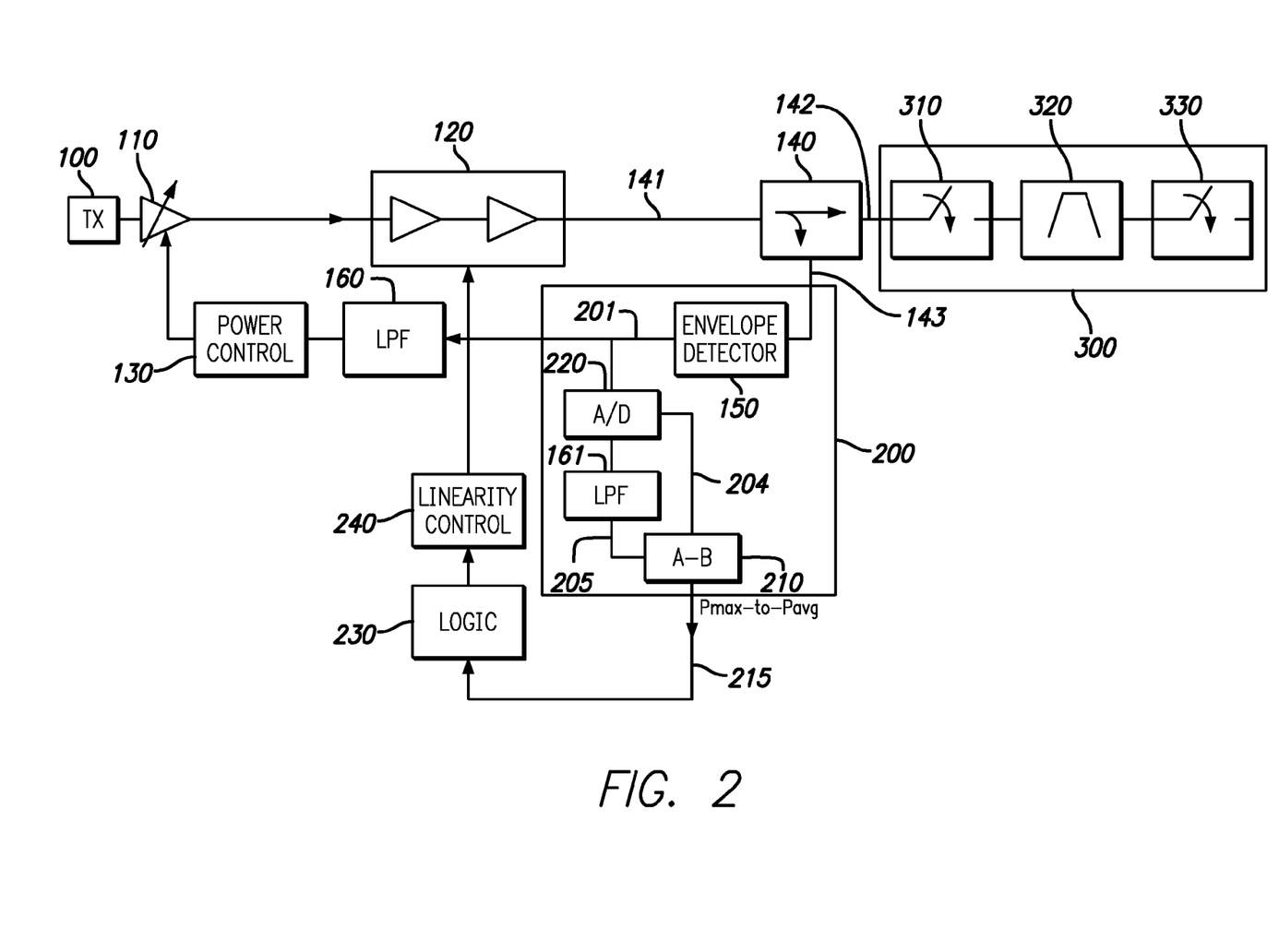
FIG. 2 shows a further embodiment, where the PAR detector calculates a peak-to-average ratio in the digital domain.

In the above embodiment described with reference to the diagram of FIG. 1, the PAR value (215) is processed as an analog value. Alternatively, as seen in FIG. 2, the PAR value (215) can be calculated in a digital domain. First, as shown in FIG. 2, the signal A (201), obtained from the envelope detector (150) is converted through an analog-to-digital converter (220). A digital value of signal B (205) is obtained by low-pass filtering (161) the digital value of signal A (204). This results in the subtractor (210) taking as input the digital signal A (204) and the digital signal B (205) and outputting a signal C (PAR value) (215) which is in a digital form, thus not requiring an analog-to-digital conversion of the output (215).

It should be noted that in FIG. 2, prior to signal A (201) being converted through the analog-to-digital converter (220), low-pass filtering (160) of signal A (201) is performed to provide an average power in the analog domain to the power control circuit (130) as in FIG. 1 (signal B (202) of FIG. 1). The function of the power control circuit (130) is the same as previously described in FIG. 1.

The arrangement shown in FIG. 1 also comprises an analog-to-digital converter (220), a logic circuit (230), and a linearity control circuit (240) used for adjusting the linearity of the one or more amplifiers (120). The analog-to-digital converter (220) converts the analog PAR value obtained from the PAR detector (200) to a digital signal that the logic circuit (230) can use.

The logic circuit (230) can operate as an indicator by determining if the one or more amplifiers (120) are running within a desired specification. The logic circuit (230) informs the linearity control circuit (240) whether or not the one or more amplifiers (120) are within a desired specified PAR value range. In other words, the logic circuit (230) informs the linearity control circuit (240) when to adjust the one or more amplifiers (120) by increasing or decreasing linearity of an amplifier.

By way of example and not of limitation, the logic circuit (230) is implemented so that the PAR value (215) is compared to a reference level that corresponds to a linearity limit. Depending on the comparison between the PAR value (215) and the reference level, the parameters of the one or more amplifiers (120) can be adjusted to adjust linearity. For example, if the PAR value (215) is higher than the reference level, the bias for the one or more amplifiers (120) can be adjusted to a lower level. Likewise, if the PAR value (215) is lower than the reference level, the bias for the one or more amplifiers (120) can be adjusted to a higher level.

In an embodiment of the logic circuit (230) of the present disclosure, the logic circuit (230) measures a peak-to-peak amplitude of a generated low frequency signal C. The peak-to-peak amplitude of the generated low frequency signal C is proportional to the PAR value of the RF signal outputted by the one or more amplifiers (120). In some embodiments it may be desirable to control the amplifier (120) based on a maximum of the peak-to-peak amplitude of the signal C over a time interval (e.g. a time constant), the maximum being more indicative of a linearity response (e.g. compression) of the amplifier. In such a case, measurement of the maximum can be made within logic circuit (230) via a peak-and-hold functionality embedded digitally. Alternatively, such peak-and-hold functionality can be implemented outside the logic circuit (230), for example at the input of the A/D converter (220), using a combination of analog and digital circuitry. Design and implementation of a peak-and-hold circuitry, whether digitally, analog or combination, is within the reach of the skilled person.

Based on the measured peak-to-peak amplitude, the logic circuit (230) provides one or more signals to the linearity control circuit (240). The linearity control circuit (240) adjusts one or more parameters controlling the linearity of the one or more amplifiers (120). The determination of the type of adjustment and when the adjustment is to be made is based on the one or more signals sent from the logic circuit (230) to the linearity control circuit (240).

According to some embodiments of the present disclosure, each of the one or more amplifiers can be a scalable periphery amplifier comprised of a plurality of amplifier unit cells arranged in a parallel configuration, each unit cell being independently configurable to be activated or deactivated. According to some embodiments each of the unit cells can also be configured to receive specific bias voltage to control a mode of operation of the particular unit cell. When using such scalable periphery amplifier, the combination of the logic circuit (230) and the linearity control circuit (240) can also control the size (e.g. periphery size) of the amplifier (e.g. number of unit cells of the scalable periphery activated) and the bias to each unit cell, with benefits ranging from enhanced linearity of the amplifier to reduced power consumption of the amplifier. Further benefits can be obtained by also modifying the load line of the amplifier (e.g. when size, supply and/or bias to scalable periphery amplifier has changed) by adjusting an output impedance of the amplifier, for example via an output tunable matching circuit provided in circuit (300). More information on scalable periphery amplifiers, including methods and systems for optimizing a scalable periphery amplifier using bias, load lines, size and supply is provided for example in U.S. patent application Ser. No. 13/797,779, entitled "Scalable Periphery Tunable Matching Power Amplifier", filed on Mar. 12, 2013, which is incorporated herein by reference in its entirety.

The logic circuit (230) and the linearity control circuit (240) control the linearity of the one or more amplifiers (120) by adjusting one or more parameters comprising bias, periphery (e.g. size of a scalable periphery amplifier), load line, and supply of the one or more amplifiers (120). One or a subset of the parameters can be adjusted to control the linearity of the one or more amplifiers (120) as necessary.

For example, as stated above, the bias of the one or more amplifiers (120) could be adjusted to change the linearity of the one or more amplifiers (120). In an embodiment, the linearity control circuit (240) could be implemented as a bias circuit which outputs a programmable reference current used to bias the one or more amplifiers (120). The reference current can be made programmable by segmenting mirror devices and turning on or off segments to adjust the output current.

It may be desired that the one or more amplifiers (120) run on the edge of linearity to maximize efficiency. Thus, the linearity of the one or more amplifiers (120) may be decreased or increased depending on the mode of operation of the one or more amplifiers (120) to achieve better efficiency. More details pertaining to linearity control with relation to the mode of operation of the one or more amplifiers (120) will be provided below, and in addition to the information provided in the afore mentioned reference, U.S. patent application Ser. No. 13/828,121 incorporated herein by reference in its entirety.

In an embodiment of the present disclosure, the peak-to-average ratio (PAR) detector (200) can be implemented on a same die separate from the transceiver (100). In a further embodiment of the present disclosure the PAR detector (200), as well as the A/D (220), the logic circuit (230), the linearity control circuit (240) and the power control (130) can be implemented in combination on a same die, or partially one a same die. In a further embodiment of the present disclosure, the amplifier (120), the coupler (140) and the variable gain amplifier (110), can also be combined (e.g. fully or partially) to the afore mentioned for monolithic integration on a same die, thus providing an autonomous power amplifier, configurable by its own built in circuits in response to changing linearity requirements. On the other hand, in some embodiments according to the present disclosure, the various circuits according to the disclosed embodiments can reside within a transceiver unit (e.g. of a hand held device). Such circuits can comprise any or all mentioned in this paragraph.

Furthermore, as parameters of the one or more amplifiers (120) are adjusted, the logic circuit (230) can continue to monitor if the adjustments keep the amplifiers within the desired specification. In an embodiment of the present disclosure, the logic circuit (230) monitors the modifications performed by the linearity control circuit (240). The logic circuit (230) re-measures the peak-to-peak amplitude of the generated low frequency waveform. By comparing multiple peak-to-peak measurements (made before and after modifications by the linearity control circuit (240)), the logic circuit (230) can make a determination if the adjustments to the one or more amplifiers (120) improve or degrade the PAR value of the RF signal. Such measurements can be made periodically, and adjustments can be made when the measurements are performed. As a precaution against variation of the adjustments, a moving average of the measurements can be implemented.

In another embodiment of the present disclosure, the peak-to-peak amplitude is measured from the output of the analog-to-digital converter (220). In such embodiment, the logic circuit (230) compares the measured peak-to-peak amplitude to a reference PAR level, which corresponds to a linearity limit of the one or more amplifiers (120). If, on one hand, the measured peak-to-peak amplitude is lower than the reference PAR level, then the RF signal is compressed. A compressed RF signal can mean that the one or more amplifiers are operating non-linearly. The linearity control circuit (240) can then adjust one or more parameters (as disclosed earlier) of the one or more amplifiers (120) to increase the linearity. On the other hand, if the peak-to-peak amplitude is higher than the reference PAR level, then the RF signal is not being compressed. A non-compressed RF signal can mean that the one or more amplifiers (120) are operating in an excessively linear fashion. The linearity control circuit (240) can then adjust one or more parameters of the one or more amplifiers (120) to decrease the linearity of the one or more amplifiers (120) similarly as described for FIG. 1.

According to yet another embodiment of the present disclosure, the reference PAR level used in the prior embodiments, can be substituted by an input PAR detected from a sampled signal at the input of the amplifier (120). For example, a second coupler placed at the input of the amplifier (120) can sample the input signal in a similar fashion as performed by the coupler (140). In such embodiment, the sampled signal at the input of the amplifier (120) can be subjected to processing similar to signal (143) (e.g. via similar circuitry (200), (220), (230)) to generate the associated input PAR which can then be used as a reference for a linearity of the input signal. By comparing such input PAR to the detected PAR via signal (143), a controller, such as the logic controller (230), can instruct the linearity control (240) for the appropriate linearity control of the amplifier (120).

According to a further embodiment of the disclosure, the logic circuit (230) can be implemented as a gradient detector (e.g. a least mean square (LMS) filter). At a given amplifier output power level, the logic circuit (230) can operate together with the linearity control circuit (240) to adjust amplifier parameters until the signal C (215) is either maximized, or within a range which is acceptable to meet an Adjacent Channel Leakage Ratio (ACLR) performance. As stated above, parameters that the logic circuit (230) and the linearity control circuit (240) control comprise bias, periphery, load line, and supply of the one or more amplifiers (120). If desired, the linearity control circuit (240) can adjust the linearity of a subset of the one or more amplifiers (120) as necessary.

Adjacent Channel Leakage Ratio (ACLR) is defined as a ratio between the transmitted power and the power in the adjacent radio channel ($P_{channel}/P_{adj}$). Ideally, a high ACLR value is desired, in order to reduce an amount of interference that a particular channel has on adjacent channels. The measurement of ACLR can also be valuable for purposes of the present disclosure because a correlation or relationship between ACLR and PAR value can determine adjustments for more efficient operation of the one or more amplifiers (120). For example, as the one or more amplifiers (120) operate in compression, efficiency of the one or more amplifiers (120) is improved. However, the further into compression the one or more amplifiers (120) operate, linearity of the one or more amplifiers (120) degrades. Linearity degrading of the one or more amplifiers (120) in turn affects ACLR and PAR value because the ACLR degrades and the PAR value for the one or more amplifiers (120) is also reduced.

Figure 3:
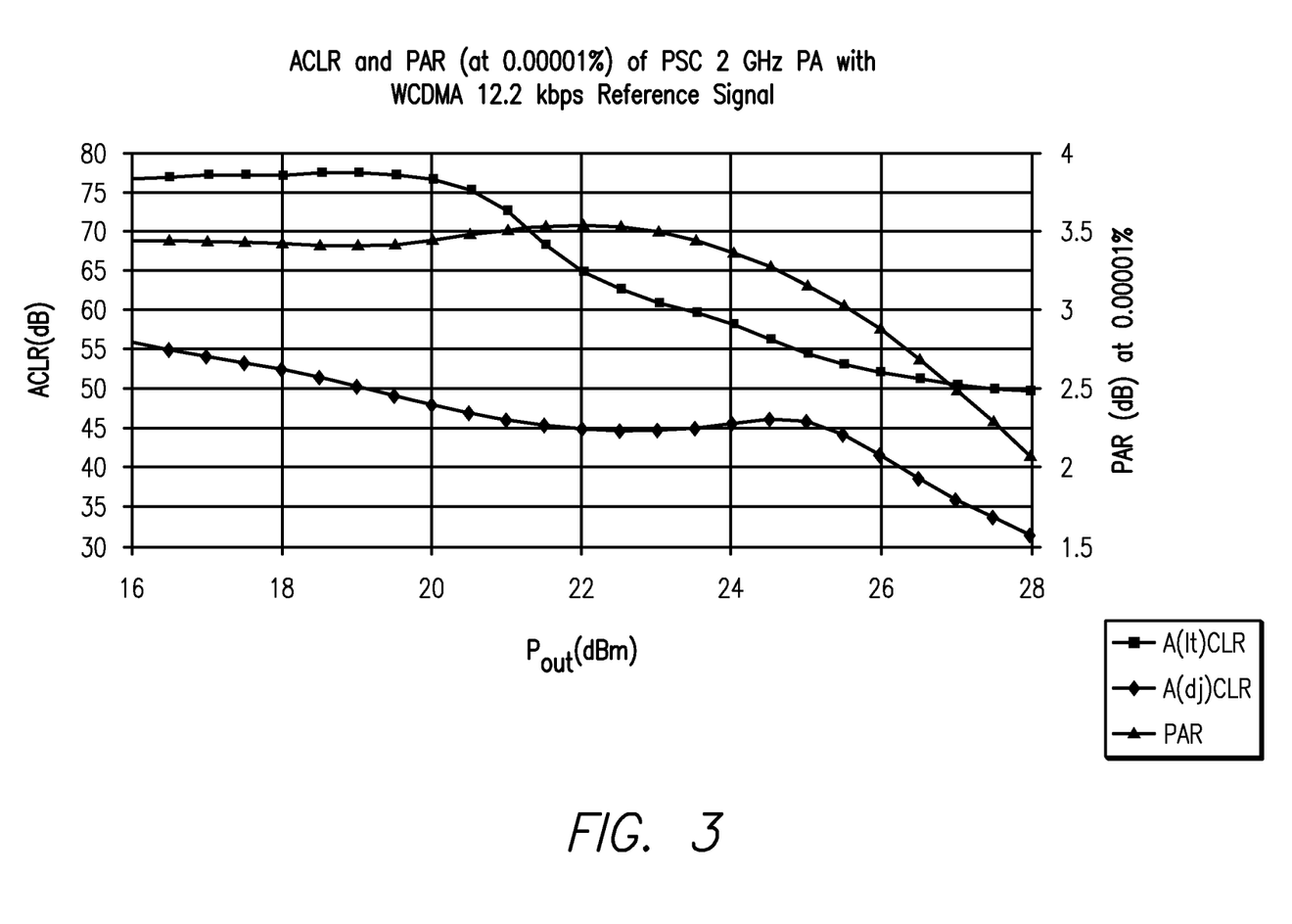
FIG. 3 shows a relationship or correlation between adjacent channel leakage ratio (ACLR) and PAR with reference to output power.
Figure 4:
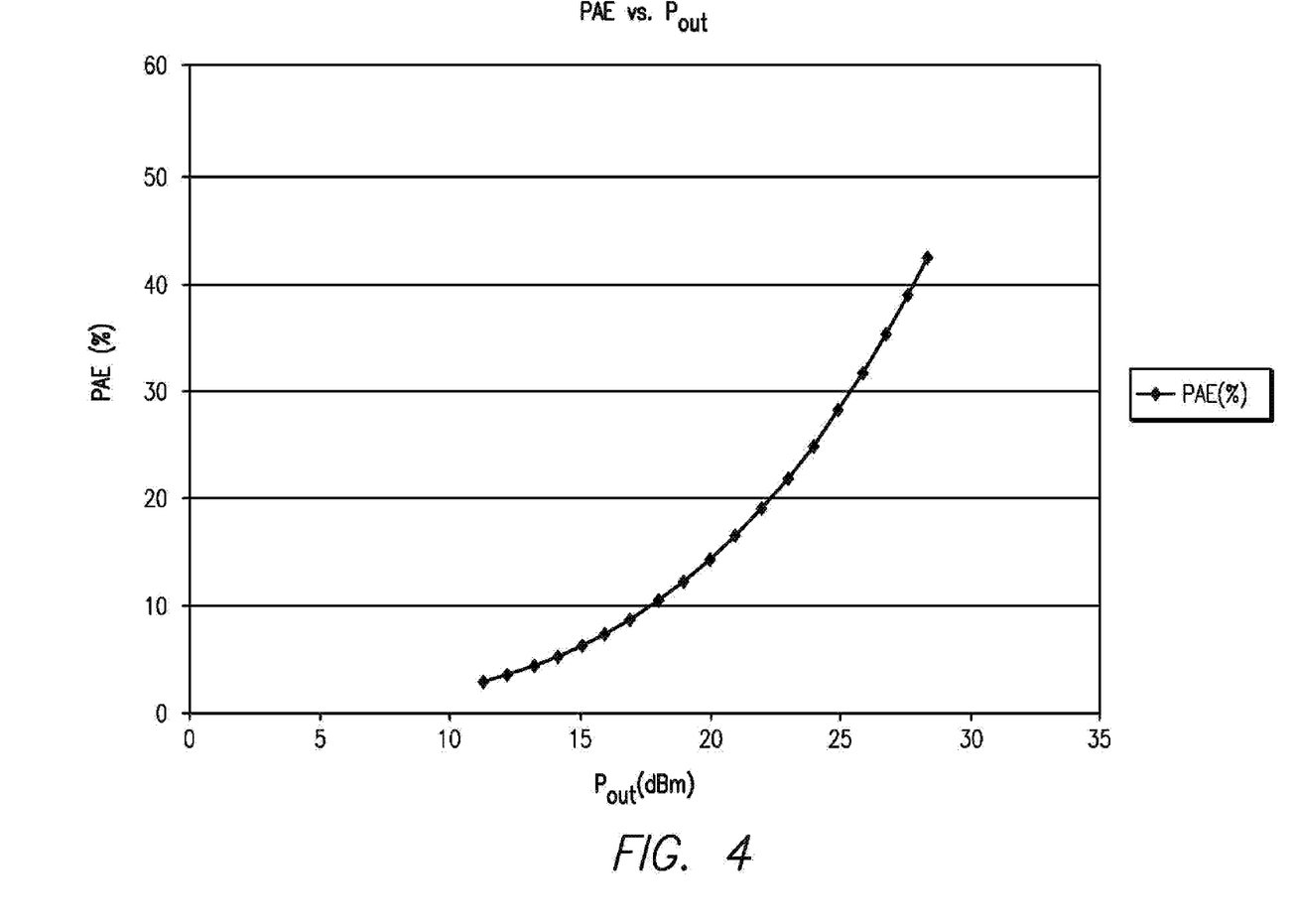
FIG. 4 shows a relationship between power amplifier efficiency (PAE) of an amplifier and output power of the same amplifier.

By way of example and not of limitation, FIG. 3 illustrates a possible correlation between ACLR and PAR (vertical axis) with reference to output power (horizontal axis), while FIG. 4 shows power amplifier efficiency (PAE) as a function of output power ($P_{out}$) prior to compression, where PAE increases at a particular rate as $P_{out}$ increases. After compression, and as the amplifier operates further in compression, PAE will begin to decrease because $P_{out}$ will increase at a slower rate as input power to the amplifier ($P_{in}$) continues to increase and as the gain of the amplifier decreases.

Turning now to the representation of FIG. 3, two different conditions of ACLR are shown, identified as A(dj)CLR and A(lt)CLR, respectively, where the first condition occurs at 5 MHz while the second condition occurs at 10 MHz. As shown in FIG. 3, ACLR (defined here as $P_{channel}/P_{adj}$) degrades as $P_{out}$ increases. On the other hand, given a low enough $P_{out}$, ACLR can achieve a maximum. With reference now to the PAR curve shown in FIG. 3, PAR initially improves up to a maximum value (which is reached for $P_{out}=22$ dBm in FIG. 3), and then decreases. Therefore, a choice of $P_{out}$ will always entail a tradeoff between ACLR and PAR, as the values of $P_{out}$ for which ACLR and PAR are maximum are usually different.

The teachings of the present disclosure may be used to adjust the linearity of amplifiers for any linear modulation standard for any cases where there is strong correlation between PAR and ACLR. Higher PAR systems could benefit more since the efficiency of such systems is usually very low to start with. According to an embodiment of the present disclosure, the low-pass filter (160) can be programmable, such as to tailor its response (e.g. cutoff frequency) according to a modulation standard being used, as a same handheld device, for example, within which the embodiments according to the present disclosure may be used, can support several modulation standards.

The examples set forth above are provided to give those of ordinary skill in the art a complete disclosure and description of how to make and use the embodiments of the peak-to-average ratio detector of the disclosure, and are not intended to limit the scope of what the inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. An arrangement comprising:
   one or more amplifiers configured, during operation of the arrangement, to provide a first signal;
   a detector operatively coupled to the first signal and configured, during operation of the arrangement, to detect an envelope of a coupled signal to produce an envelope signal;
   a filter operatively connected to the detector and configured, during operation of the arrangement, to filter the envelope signal to produce an average power signal that corresponds to an average power of the coupled signal;
   a subtractor operatively connected to the detector and the filter and configured, during operation of the arrangement, to produce a difference signal that corresponds to the difference between the envelope signal and the average power signal;
   and
   a circuital arrangement operatively connected to the subtractor and configured, during operation of the arrangement, to adjust one or more parameters of the one or more amplifiers based on the difference signal.

2. The arrangement according to claim 1, wherein the circuital arrangement further comprises:
   an analog-to-digital converter operatively connected to the subtractor and configured, during operation of the arrangement, to produce a digital signal that corresponds to a digital version of the difference signal;
   a logic circuit operatively connected to the analog-to-digital converter and configured, during operation of the arrangement, to produce one or more logic circuit output signals that are a function of the digital signal, and
   a linearity control circuit operatively connected to the logic circuit and configured, during operation of the arrangement, to adjust the one or more parameters of the one or more amplifiers based on the one or more logic circuit output signals.

3. The arrangement according to claim 1 further comprising a coupler operatively connected to the detector and configured during operation of the arrangement to provide the coupled signal from the first signal.

4. The arrangement according to claim 3, wherein the coupler is an RF coupler.

5. The arrangement according to claim 4, wherein the RF coupler is a broadband RF coupler.

6. The arrangement according to claim 4, wherein the coupler is a capacitive coupler.

7. The arrangement according to claim 3, wherein the coupler is also operatively connected to a downstream circuit and configured, during operation of the arrangement, to provide a transmitted signal.

8. The arrangement according to claim 1 further comprising:
   a transceiver and a variable gain amplifier, the transceiver being operatively connected to the variable gain amplifier and configured, during operation of the arrangement, to provide an input signal; and
   a power control circuit, operatively connected to the filter and configured, during operation of the arrangement, to compare the average power signal obtained to a reference level and provide a corresponding signal to the variable gain amplifier,
   wherein the variable gain amplifier is operatively connected to the one or more amplifiers and is configured, during operation of the arrangement, to control a first amplification of the input signal from the transceiver to the one or more amplifiers based on the output from the power control circuit.

9. The arrangement according to claim 8, wherein the arrangement further comprises a second coupler operatively coupled to an input signal of the one or more amplifiers, and wherein the reference level is based on a level of a coupled signal from the second coupler.

10. The arrangement according to claim 9, wherein the reference level is based on a level of a peak-to-average ratio of the coupled signal from the second coupler.

11. The arrangement according to claim 1, wherein the detector comprises a diode or is a root mean square detector.

12. The arrangement according to claim 1, wherein the filter is a low-pass filter.

13. The arrangement according to claim 1, wherein the difference signal corresponds to a peak-to-average ratio of the coupled signal.

14. The arrangement according to claim 1, wherein the detector, the filter and the subtractor are part of a peak-to-average detector of the arrangement.

15. The arrangement according to claim 1, wherein an amplifier of the one or more amplifiers is a scalable periphery amplifier.

16. The arrangement according to claim 1 further comprising a tunable match circuit operatively coupled to the one or more amplifiers, wherein the circuital arrangement is further configured to adjust the tunable match circuit based on the difference signal.

17. The arrangement according to claim 16, wherein the tunable match comprises a harmonic termination.

18. The arrangement according to claim 1, wherein the one or more parameters are selected from among a group consisting of bias, periphery size, load line, and supply of the one or more amplifiers.

19. The arrangement according to claim 1, wherein the one or more parameters are selected from among a group consisting of bias, periphery size, load line, and supply of the one or more amplifiers.

20. The arrangement according to any one of claims 1-3, 8 wherein the arrangement is entirely or partially monolithically integrated.

21. The arrangement according to any one of claims 1-3, further comprising a transceiver, wherein one or more of: a) the coupler, b) the detector, c) the filter, d) the subtractor, e) the analog-to-digital-converter, f) the logic circuit, and g) the linearity control circuit, is integrated within the transceiver.

22. A method comprising:
feeding an input signal to a plurality of amplifiers;
splitting an amplified input signal, one branch of the amplified input signal being provided to a detector as a split amplified input signal;
detecting an envelope of the split amplified input signal;
producing an envelope signal based on the detected envelope of the split amplified input signal;
filtering the envelope signal to produce an average power signal of the split amplified input signal;
subtracting the average power signal from the envelope signal to produce a difference signal corresponding to a peak-to-average ratio of the split amplified input signal;
converting the difference signal from an analog signal to a digital signal;
producing logic output signals as a function of the digital difference signal and a linearity limit; and
adjusting linearity of the plurality of amplifiers based on the logic output signals.

23. The method according to claim 22, further comprising:
comparing the produced average power signal of the split amplified input signal with a reference level; and
controlling an output level of an amplifier, the output level corresponding to the input signal being fed to the plurality of amplifiers.

24. The method according to claim 22, wherein:
adjusting linearity of the plurality of amplifiers further comprises adjusting one or more parameters, wherein the one or more parameters comprise one or more bias, periphery size, load line and supply of the one or more amplifiers.

25. The method according to claim 22, further comprising:
comparing multiple peak-to-peak measurements to determine improvement or degradation of the difference signal.

26. The method according to claim 25, wherein the multiple peak-to-peak measurements form a moving average.

27. A method for affecting operation of an amplifier, the method comprising:
operatively connecting a coupler at an output of the amplifier;
based on the connecting, detecting an envelope signal of an output signal of the amplifier;
low pass filtering the envelope signal, thereby obtaining an average envelope signal;
subtracting the envelope signal from the average envelope signal, thereby generating a peak-average ratio signal based on the output signal of an amplifier;
based on the generating, producing one or more control signals adapted to control operation of the amplifier;
feeding the one or more control signals to the amplifier, and
based on the feeding, affecting an operational parameter of the amplifier.

28. The method of claim 27, wherein the affecting of the operational parameter of the amplifier further comprises changing one or more of: a) a bias voltage, b) a periphery size, c) a load line, and d) a supply, of the amplifier.

29. The method of claim 28, wherein the affecting of the operational parameter of the amplifier minimizes a linearity response of the amplifier.

30. The method of claim 28, wherein changing a load line comprises adjusting a tunable matching circuit coupled to the amplifier.

* * * * *